United States Patent
Wada et al.

(10) Patent No.: US 6,316,343 B1
(45) Date of Patent: Nov. 13, 2001

(54) METHOD OF FORMING TRANSPARENT CONDUCTIVE FILM AND TRANSPARENT CONDUCTIVE FILM FORMED BY THE METHOD

(75) Inventors: Syunji Wada; Hiroshi Yagawa; Motohisa Mineo; Yuichi Aoki, all of Osaka; Ryoji Chikugo; Akihiko Yoshii, both of Niihama, all of (JP)

(73) Assignees: Nippon Sheet Glass Co., Ltd.; Sumitomo Heavy Industries, Ltd., both of (JP)

( * ) Notice: Subject to any disclaimer, the term of this patent is extended or adjusted under 35 U.S.C. 154(b) by 0 days.

(21) Appl. No.: 09/538,069

(22) Filed: Mar. 29, 2000

(30) Foreign Application Priority Data

Apr. 1, 1999 (JP) .................................. 11-094764

(51) Int. Cl.[7] .................................................. H01L 21/20
(52) U.S. Cl. ............................................................. 438/584
(58) Field of Search ........................... 438/584, 98, 592, 438/609; 257/59

(56) References Cited

U.S. PATENT DOCUMENTS 5,009,922 * 4/1991 Harano et al. .......................... 427/37
5,013,416 * 5/1991 Murayama et al. .............. 204/192.1

* cited by examiner

Primary Examiner—David Nelms
Assistant Examiner—Quoc Hoang
(74) Attorney, Agent, or Firm—Rossi & Associates

(57) ABSTRACT

A method of manufacturing a transparent conductive film is provided, which is capable of obtaining a transparent conductive film having both reduced specific resistance and reduced film compressive stress, and a transparent conductive film manufactured by the same method is also provided. The temperature of a substrate placed in opposed relation to an anode is set to not more than 130° C. A plasma beam is generated by discharge plasma generating means constituting a cathode and guided to the anode such that an evaporation material received in the anode evaporates and particles of the evaporated materials are ionized, to thereby form the transparent conductive film on a surface of the substrate. The transparent conductive film thus formed is subjected to a heat treatment at a temperature of not less than 180° C. The resulting transparent conductive film has a specific resistivity of 230 $\mu\Omega\cdot cm$ or less and a film compressive stress of 0.35 GPa or less.

5 Claims, 4 Drawing Sheets

METHOD OF FORMING TRANSPARENT CONDUCTIVE FILM AND TRANSPARENT CONDUCTIVE FILM FORMED BY THE METHOD

BACKGROUND OF THE INVENTION

1. Field of the Invention

The present invention relates to a method of forming a transparent conductive film on a substrate of a color filter for liquid crystal displays and a transparent conductive film formed by the method.

2. Prior Art

Oxide indium films with addition of tin (hereinafter referred to "ITO films") are generally used as excellent transparent conductive films (transparent electrode films) formed on substrates of color filters for liquid crystal displays.

Conventionally known methods for forming such ITO films include a vacuum evaporation method, spattering method, and RF (radio frequency) ion-plating method.

Transparent conductive films for color liquid crystal displays are required to be thin for high resolution and high light transmittance, and also required to have a low specific resistance and high uniformity for increased size and increased response speed.

In forming an ITO film on a surface of a transparent glass plate or a transparent resin plate as a substrate of a color filter for a color liquid crystal display using any of the above methods, in order to avoid thermal deterioration of the color filter which is usually formed of an organic resin such as an epoxy resin or an acrylic resin with a pigment or a dye mixed therein, the formation of the ITO film is carried out with the temperature of the substrate being set to 250° C. or less at or below which the deterioration of the resin forming the color filter does not occur. As a consequence of the low temperature of the substrate, the reaction of indium and oxygen on the substrate and crystallization of a film to be formed are not effected to a sufficient degree, resulting in formation of a film with a small crystal grain size and many defects, i.e. pores. The ITO film thus formed has many defects or pores which capture the carriers, and consequently the film has a reduced carrier electron density and hence an increased specific resistance.

To overcome the above disadvantage, there has been proposed an apparatus which forms an ITO film using an ion plating method. An example of this apparatus is shown in FIG. 1. In the figure, a vacuum vessel 1 inside which a vacuum chamber 1a is defined has a mounting opening 2 formed in a side wall thereof, at which a guide part 3 is mounted on the vacuum vessel 1. Mounted on the guide part 3 is an arc discharge plasma gun 4 such as a pressure gradient type plasma gun, which serves as discharge plasma generating means constituting a cathode. Further provided on the guide part 3 is a steering coil 5 for guiding a plasma beam. The plasma gun 4 includes a first intermediate electrode 6 and a second intermediate electrode 7 which are concentrically arranged for the convergence of the plasma beam.

The plasma gun 4 further includes an insulating tube 8, the interior of which communicates with a passage defined by the first and second intermediate electrodes 6, 7. Arranged inside the insulating tube 8 is a Mo cylinder 9 formed of molybdenum (Mo), inside which is arranged a Ta pipe 10 formed of tantalum (Ta), with a space between the cylinder 9 and the pipe 10 being partitioned by an annular plate 11 formed of $LaB_6$ (lanthanum hexaboronite). Mounted on ends of the insulating tube 8, Mo cylinder 9 and Ta pipe 10 is a conductive plate 12 which has a carrier gas inlet opening 13 formed therein, through which an Ar gas as a carrier gas is introduced and passes through the Ta pipe 10.

At an upper location within the vacuum chamber 1a, a substrate 14 as an object to be processed is supported by a conveyer device 15. At a lower location within the vacuum chamber 1a, a hearth 17 which accommodates a permanent magnet 24 is arranged in opposed relation to the substrate 14 to serve as a main anode. An evaporation material 18 formed of indium oxide with addition of tin is received in the hearth 17. A magnet case 20 accommodating a permanent magnet 19 is arranged around the hearth 17 via an insulating material, not shown. The permanent 19 and the magnet case 20 constitute an auxiliary anode for correcting the plasma beam direction.

A negative electrode side of a variable voltage power supply 21 is connected to the conductive plate 12. A positive electrode side of the variable voltage power supply 21 is connected to the first intermediate electrode 6 through a resistor R1, as well as to the second intermediate electrode 7 through a resistor R2. The positive electrode side of the power supply 21 is also connected to the hearth 17, and grounded through a resistor R3.

A gas inlet opening 22 and a gas discharge opening 23 are formed in another side wall of the vacuum vessel 1. The gas inlet opening 22 introduces a carrier gas formed of a mixture of argon and oxygen or oxygen. The gas discharge opening 23 discharges the carrier gas within the vacuum chamber 1a to the outside.

With the above construction of the conventional ion plating apparatus, when the carrier gas is introduced through the gas inlet opening 22, a discharge occurs between the first intermediate electrode 6 and the Mo cylinder 9 so that a plasma beam 30 is generated. The plasma beam 30 is guided by the steering coil 5 and the permanent magnet 19 within the magnet case 20 to reach the hearth 17 forming the anode and the magnet case 20. Accordingly, the evaporation material 18 received in the hearth 17 is Joule-heated by the plasma beam 30 to evaporate. Particles of the evaporated material 18 are ionized while passing the plasma beam 30 and attached to a surface of the substrate 14 that is opposed to the hearth 17 to form a thin film (ITO film) thereon.

FIG. 2 is a vertical sectional view showing details of the substrate 14 with the ITO film formed on the surface thereof. As shown in the figure, a color filter 14b for a color liquid display is formed on a transparent glass plate 14a, and a protective film 14c formed of an organic resin such as an acrylic resin is formed on the color filter 14b. The color filter 14b is formed of an organic resin such as an acrylic resin with a pigment and a dye mixed therein.

In forming an ITO film which is a transparent conductive film using the conventional ion plating apparatus constructed as above, when the evaporation material 18 is heated by the plasma beam 30 to evaporate, particles of the evaporated material 18 are ionized while passing the plasma beam 30 and attached to the substrate 14 to form a thin film on the surface thereof. Since these particles of the evaporated material 18 are indium atoms, positively ionized indium particles attached to the substrate 14 react with an $O_2$ component of the carrier gas introduced into the vacuum chamber 1a through the gas inlet opening 22 to form the ITO film 14d on the surface of the substrate 14. On this occasion, a vertical magnetic field is formed by the permanent magnet 19 and the magnet case 20 so that the plasma density increases to increase the temperature of electrons, which promotes the reaction of indium and $O_2$ component of the carrier gas and crystallization thereof. Consequently, the formed ITO film has a sufficient carrier electron density and hence a reduced specific resistance. That is, an ITO film having a specific resistance of 150 $\mu\Omega$·cm or less can be obtained.

According to the conventional ion plating apparatus, however, the discharge voltage of the plasma beam 30 that reaches the hearth 17 is so high that positive ions generated when particles of the evaporated material 18 pass the plasma beam 30 are accelerated to a higher degree than required. Consequently, the accelerated particles are implanted into the ITO film being formed on the surface of the substrate 14 at too high a speed, to form defects or pores in the ITO film, resulting in increased film compressive stress (increased internal compressive stress of the ITO film). For example, an ITO film formed at 250° C. or less has a film compressive stress of 0.55 GPa or more at a specific resistance of 230 $\mu\Omega$·cm or less, which is larger than that obtained by other film forming methods such as the vacuum evaporation method, spattering method, and RF ion-plating method.

Particularly, the manufacture of a color liquid crystal display essentially requires a step of heating a substrate formed of a resin for a color filter after an ITO film is formed on a surface of the substrate. During this step, the ITO film which has a high film compressive stress can become broken.

SUMMARY OF THE INVENTION

It is an object of the present invention to provide a method of manufacturing a transparent conductive film which is capable of obtaining a transparent conductive film having both reduced specific resistivity and reduced film compressive stress, and a transparent conductive film manufactured by the same method.

To attain the above object, the present invention provides a method of manufacturing a transparent conductive film, comprising the steps of:

1) setting a temperature of a substrate placed in opposed relation to an anode to not more than 130° C.;

2) generating a plasma beam by discharge plasma generating means constituting a cathode and guiding the plasma beam to the anode such that an evaporation material received in the anode evaporates and particles of the evaporated materials are ionized, to thereby form the transparent conductive film on a surface of the substrate; and 3) subjecting the transparent conductive film thus formed to a heat treatment at a temperature of not less than 180° C.

Preferably, the temperature of the heat treatment of the step 3) has an upper limit of 240° C.

Also preferably, the heat treatment of the step 3) is conducted for a period of time of 30 to 60 minutes.

To attain the above object, the present invention also provides a transparent conductive film which is formed by the above method according to the present invention, and which has a specific resistivity of 230 $\mu\Omega$·cm or less and a film compressive stress of 0.35 GPa or less.

The above and other objects of the invention will become more apparent from the following description taken in conjunction with the accompanying drawings.

DETAILED DESCRIPTION OF PREFERRED EMBODIMENT

The present invention will now be described in detail with reference to the drawings showing an embodiment thereof.

To solve the above-mentioned problem with the prior art, the present inventors have made studies to reach a finding that in implementing a method of forming a transparent conductive film on a surface of a substrate, which comprises generating a plasma beam by discharge plasma generating means constituting a cathode and guiding the plasma beam to an anode such that an evaporation material received in the anode evaporates and particles of the evaporated materials are ionized, whereby the ionized parts of the evaporated material are attached to the surface of the substrate, to thereby form the transparent conductive film on the surface of the substrate, if the transparent conductive film is formed on the surface of the substrate with the temperature of the substrate being set to not more than 130° C., and then a heat treatment is conducted on the transparent conductive film thus formed at a temperature of not less than 180° C., the resulting transparent conductive film has a specific resistivity of 230 $\mu\Omega$·cm or less and a film compressive stress of 0.35 GPa or less.

The present invention is based upon the above finding.

Figure 1:
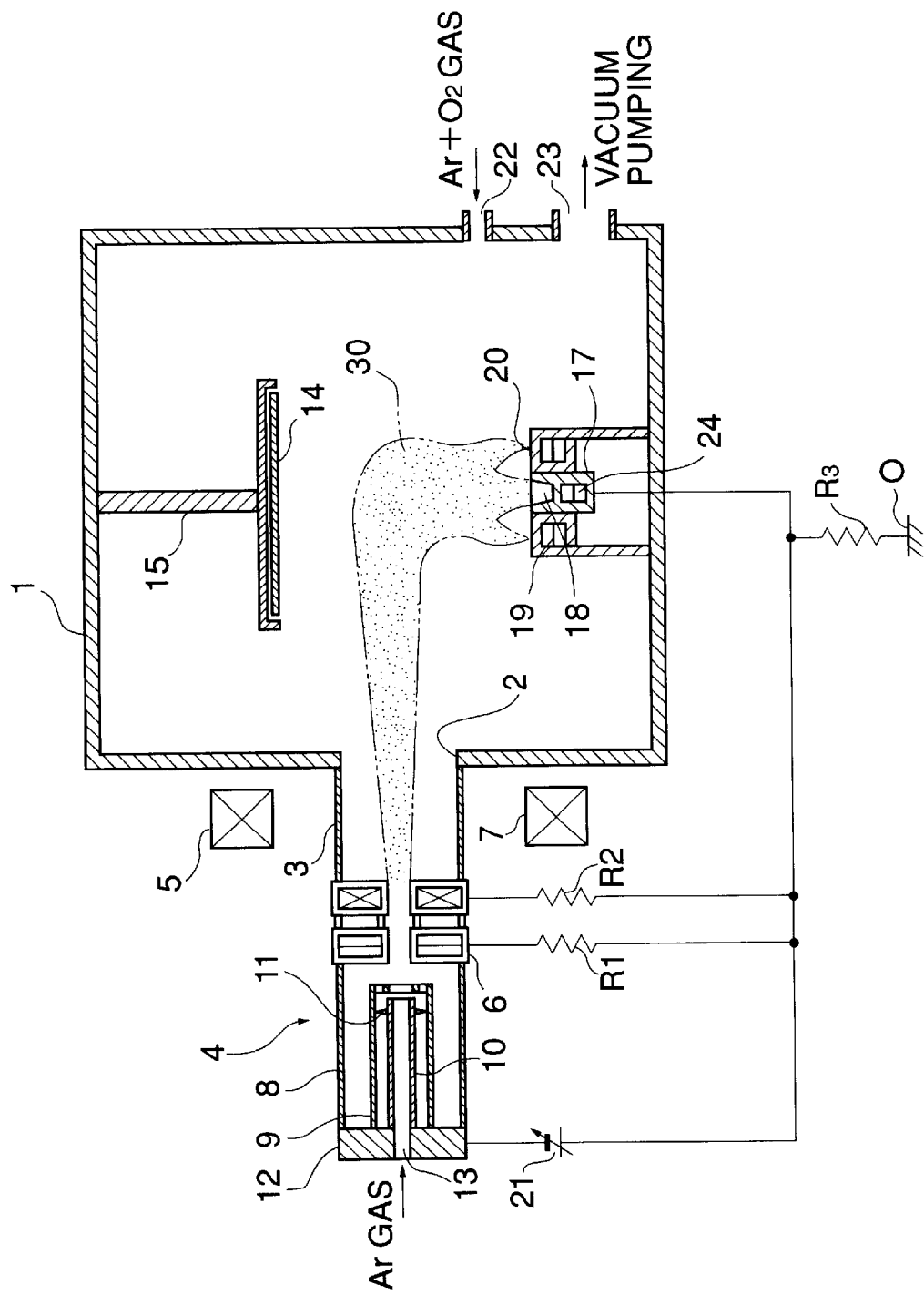
FIG. 1 is a vertical sectional view showing the construction of an apparatus which can be used to implement a method of forming a transparent conductive film according to the present invention.
Figure 2:
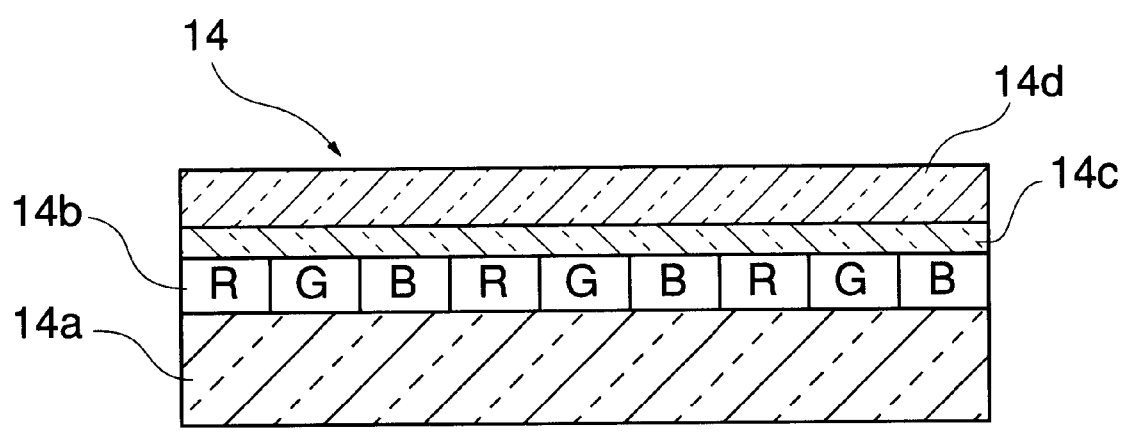
FIG. 2 is a vertical sectional view showing the structure of a substrate used in implementing the method of forming a transparent conductive film according to the present invention.

When the method of forming a transparent conductive film according to the present invention is applied to the manufacture of a substrate for a color filter for liquid crystal displays, the method can be implemented by the conventional ion plating apparatus as shown in FIG. 1 or a like apparatus. In the present embodiment, an ITO film is formed as the transparent conductive film.

Figure 3:
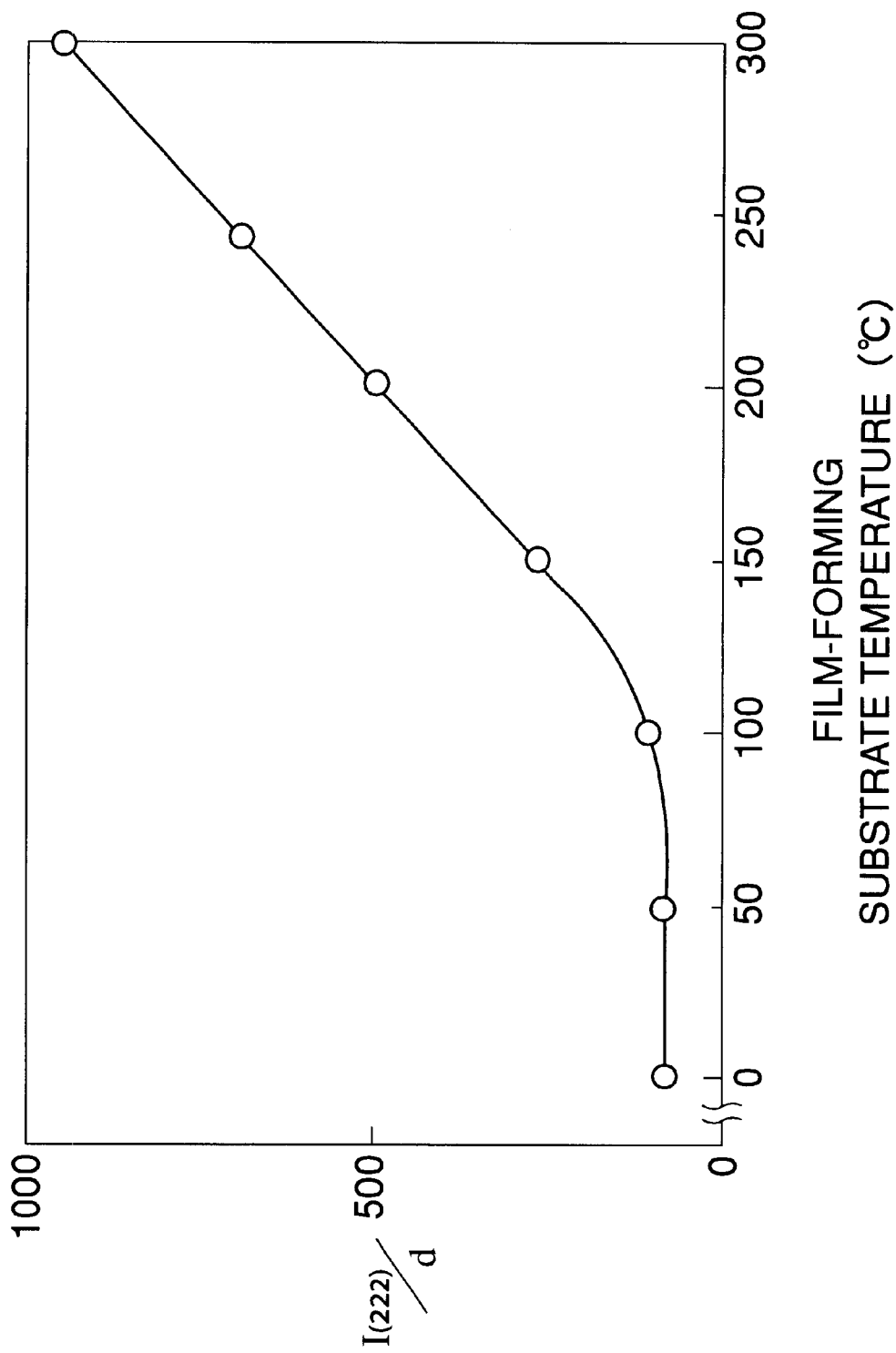
FIG. 3 is a graph showing the relationship between the temperature of a substrate on which an ITO film is to be formed and the degree of crystallization when a heat treatment has been carried out on an ITO film formed at room temperature (substrate temperature: 70° C.), under conditions of atmospheric pressure of 3 mTorr and heat treatment time of 10 minutes.

In forming the ITO film, the substrate 14 is heated to a temperature of 130° C. or less by heating means (not shown) mounted on the conveyer device 15. More specifically, the film compressive stress of the ITO film is largely affected by crystallization of the film (formation of crystalline nucleus and subsequent crystal growth) occurring during formation of the ITO film on the substrate. The crystallization of the film is in turn largely affected by the temperature of the substrate during formation of the film (hereinafter referred to as "the film-forming substrate temperature"). Therefore, the film-forming substrate temperature has to be not more than 130° C. which is the upper limit of temperature at or below which the formed ITO film cannot be crystalline. FIG. 3 is a graph showing the relationship between the temperature of a substrate on which an ITO film is to be formed and the degree of crystallization when a heat treatment has been carried out on an ITO film formed at room temperature (substrate temperature: 70° C.), under conditions of atmospheric pressure of 3 mTorr and heat treatment time of 10 minutes. In the graph, the film-forming substrate temperature is plotted along the abscissa, and the degree of crystallization along the ordinate. The degree of crystallization is represented by a value I(222)/d obtained by dividing X-ray diffraction strength with respect to a (222) plane by the film thickness d. As shown in the graph, when the film-forming substrate temperature exceeds 130° C., the crystal growth starts, and as the temperature further increases, the crystal growth becomes more active. At 150° C., the crystal growth can be clearly perceived. This is why the upper limit of the heating temperature (film-forming substrate temperature) has been limited to not more than 130° C. On the other hand, the lower limit of the heating temperature is set to a temperature as high as room temperature, that is, a temperature corresponding to a non-heated state of the substrate. At room temperature, the degree of crystallization of the ITO film is lower than at 130° C., so that the resulting ITO film is amorphous and has a high specific resistance, but a heat treatment on the ITO film following the formation thereof can bring the film into a state of low specific resistance and low film compressive stress. In actual manufacture, however, radiation heat generated by evaporation of the evaporation material reaches the substrate 14 so that the substrate 14 is heated to a temperature as high as 60° C. to 70° C., even if the heating means is not operated to set the film-forming substrate temperature to room temperature.

After the ITO film 14d is thus formed on the surface of the substrate 14, the ITO film 14d is heat treated at a temperature of 180° C. or more. More specifically, after the formation of the ITO film 14d, a mixture gas of argon and oxygen or oxygen is introduced as a carrier gas into the vacuum chamber 1a, and the atmospheric temperature within the vacuum vessel 1 is heated to 180° C. or more to thereby heat treat the ITO film 14d within the vacuum chamber 1a. By thus carrying out heat treatment at a temperature of 180° C. or more, strain in a crystal structure formed in the ITO film 14d due to crystal growth of the ITO film from a state where no crystal structure develops can be released, so that the ITO film has reduced film stress and reduced specific resistivity. Thus, an ITO film can be obtained which has a specific resistivity of 230 $\mu\Omega\cdot$cm or less and a film compressive stress of 0.35 GPa or less. The heat treatment may be carried out in an alternative manner such that the substrate 14 with the ITO film 14d formed thereon is removed from the vacuum vessel 1 and subjected to heat treatment in the air at a temperature of 180° C. to 240° C.

The heat treatment temperature should be 180° C. or more as mentioned above, because only when the heat treatment temperature is 180° C. or more, sufficient crystal growth of the ITO film from a state where no crystal structure develops can be effected and a specific resistance value and a film compressive stress value which are practically low to a satisfactory extent can be obtained through release of strain in the crystal structure formed in the ITO film due to the crystal growth of the ITO film.

The upper limit of the heat treatment temperature should be preferably 240° C. If the heat treatment temperature exceeds 240° C., the organic resin forming the substrate of the color filter can be thermally deteriorated. By thus setting the upper limit of the heat treatment temperature to 240° C. to avoid thermal deterioration of the substrate, electrode patterning can be actually performed in a positive manner and the resulting ITO film can be resistant to chemicals such as alkalis.

Figure 4:
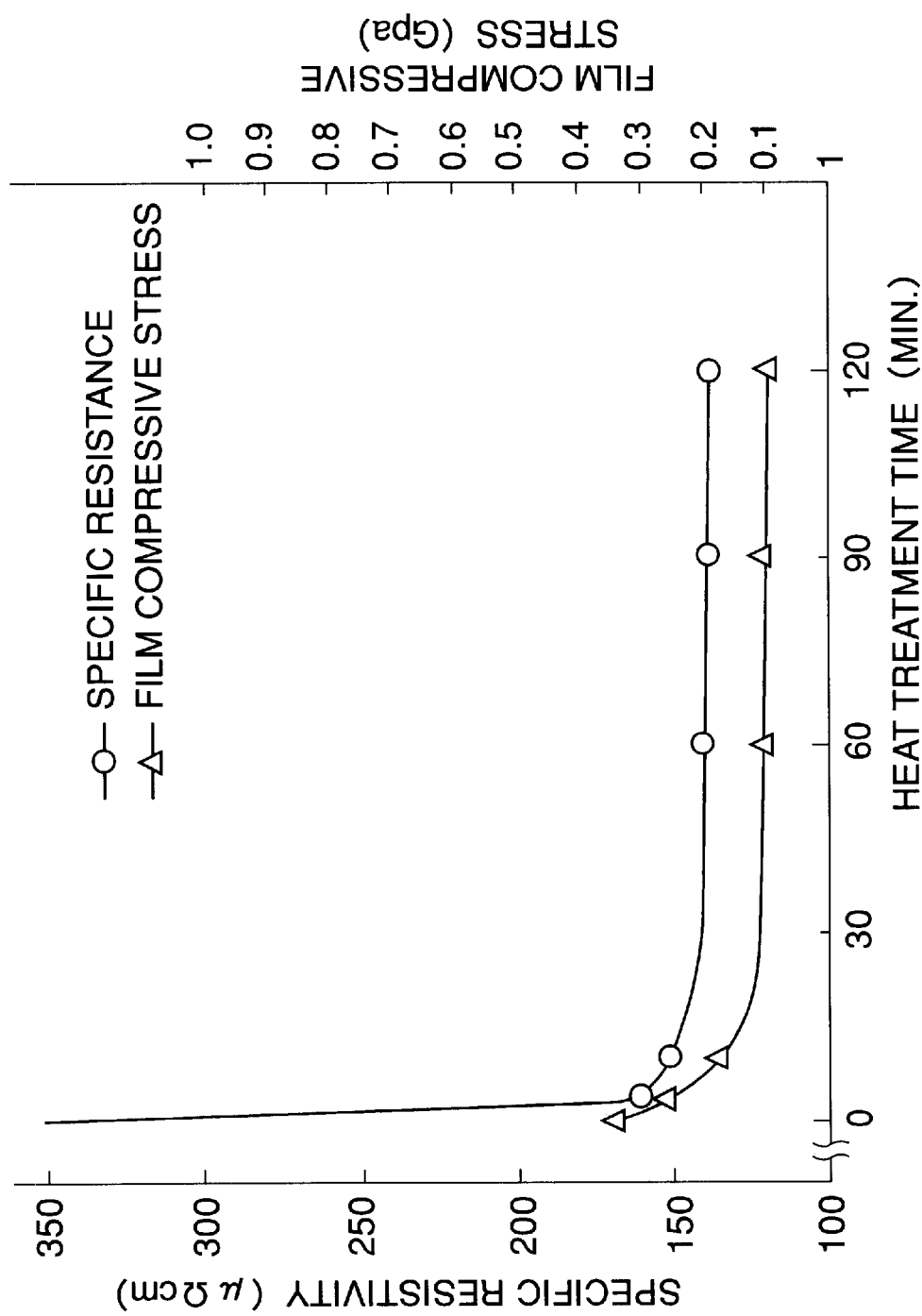
FIG. 4 is a graph showing the specific resistance and film compressive stress of an ITO film obtained by carrying out a heat treatment on the ITO film formed at room temperature (substrate temperature: 70° C.), under conditions of atmospheric pressure of 3 mTorr and heat treatment temperature of 240° C.

The heat treatment time should be preferably 3 to 60 minutes. FIG. 4 is a graph showing the specific resistance and film compressive stress of an ITO film obtained by carrying out a heat treatment on the ITO film formed at room temperature (substrate temperature: 70° C.), under conditions of atmospheric pressure of 3 mTorr and heat treatment temperature of 240° C. As shown in FIG. 4, the specific resistance and film compressive stress are suddenly reduced immediately after the start of the heat treatment and until the lapse of 3 minutes, and after the lapse of 3 minutes, sufficient crystal growth of the ITO film from a non-crystalline state thereof and sufficient release of crystal structure strain are obtained. Thus, the lower limit of the heat treatment time should be 3 minutes. On the other hand, if the heat treatment time exceeds 60 minutes, the effect of release of crystal structure strain becomes saturated so that no further decrease in the specific resistance and film compressive stress can be obtained. Thus, the upper limit of the heat treatment time should be 60 minutes.

EXAMPLES

Examples of the present invention will be described below.

As the substrate 14, RGB color filters for liquid crystal displays (formed of an acrylic resin with a pigment and a dye mixed therein) were formed on transparent glass plates, respectively, and then protective films formed of an organic resin such as an acrylic resin were formed on these color filters, respectively, to prepare substrates of Examples Nos. 1 to 10 according to the present invention and Comparative Examples Nos. 1 to 6.

Then, an ITO film was formed on each of the substrates under the following conditions:

Evaporation Material: Sintered body of indium oxide containing 4 wt. % of tin oxide Atmospheric Gas for Film Formation: Mixture gas of argon and oxygen under total pressure of 0.027 Pa Oxygen Partial Pressure: 0.0027 Pa Discharge Current: 150A Discharge Voltage: 70V Film-forming Substrate Temperature: 70° C. to 180° C.

More specifically, the substrates 14 of Examples Nos. 1–10 were previously heated to 30° C. to 130° C., and the substrates 14 of Comparative Examples Nos. 1 to 6 to 70° C. to 180° C., by the heating means, and then the interior of the vacuum vessel 1 was evacuated into 0.0027 Pa or less by an evacuation pump. Then, argon gas was introduced into the vacuum vessel 1 through the arc discharge plasma gun 4, and discharge current is supplied to create an arc discharge plasma beam, which was irradiated on the evaporation material 18 to cause the same to evaporate. During the formation of the ITO film, a mixture gas of argon and oxygen as a carrier gas was introduced into the vacuum vessel 1 through the gas inlet opening 22 for adjusting the atmosphere so as to maintain the atmospheric pressure within the vacuum vessel 1 at the above indicated value. The film formation was carried out for a predetermined period of time empirically determined in advance, to form an ITO film having a thickness of 150 nm on the surface of each of the substrates. Characteristics of the formed ITO films are shown in Table 1.

Then, after the ITO films were thus formed, heat treatments were conducted on the substrates of the examples according to the present invention and comparative examples other than Comparative Examples Nos. 3 to 6. More specifically, as to Examples Nos. 1 to 6 and Comparative Examples No. 1, a mixture gas of argon and oxygen was introduced into the vacuum vessel 1, the atmospheric pressure was adjusted to a range of 0.002 Torr to 0.003 Torr, and the substrate 14 was heated at a heat treatment temperature of 180° C. to 240° C. and for a heat treatment time of 3 to 60 minutes, to thereby heat treat the ITO film 14d of each substrate in the vacuum chamber 1a. On the other hand, as to Examples Nos. 7 to 10 and Comparative Example No. 2, the substrate 14 with the ITO film 14d formed thereon was heat treated under conditions of atmospheric pressure of 760 Torr (air), a heat treatment temperature of 180° C. to 240° C., and a heat treatment time of 15 to 60 minutes to thereby heat treat the ITO film 14d.

Then, the ITO films of the substrates of Examples Nos. 1 to 10 and Comparative Examples Nos. 1 and 2 thus subjected to heat treatment and the ITO films of Comparative Examples Nos. 3 to 6 which were not subjected to heat treatment were evaluated in respect of an electric characteristic and film compressive stress by the following methods.

That is, as to the electric characteristic, the sheet resistance of the ITO film was measured by the four probe method, and the specific resistance of the film was measured based on the measured sheet resistance and the film thickness.

On the other hand, the film compressive stress was measured by the X-ray diffraction method. More specifically, a value of the angle of diffraction prescribed by the crystal grating interval measured by the X-ray diffraction method was compared with a value of the angle of diffraction measured with respect to an ITO powder free of stress, and the difference in angle of diffraction was regarded as a crystal strain to thereby determine an amount of strain of the crystal structure. Based on the determined amount of strain, the relationship between the amount of strain and the film compressive stress was calculated using values of physical properties of the ITO film. More specifically, a model RAD-γC manufactured by Rigaku Corporation (with a chromium lamp of a power of 40 Kv and 200 mA: λ=2.289A) was used as a measuring instrument, and the film compressive stress was measured using a pressure measuring program attached to the instrument. As the above physical properties of the ITO film, Young's modulus of 116 GPa, Poisson's ratio of 0.350, and a stress constant of −659.89 MPa were used. In addition, a value of the angle of diffraction in the case where the crystal structure contains no strain was assumed to be 97.3022°.

Values of the electric characteristic (specific resistivity) and film compressive stress thus obtained are also shown in Table 1.

TABLE 1

| SPECIMENS | FILM-FORMING SUBSTRATE TEMPERATURE (° C.) | FILM CHARACTERISTICS IMMEDIATELY AFTER FILM FORMATION | | HEAT TREATMENT CONDITIONS | | | FILM CHARACTERISTICS AFTER HEAT TREATMENT | |
|---|---|---|---|---|---|---|---|---|
| | | SPECIFIC RESISTIVITY (μ Ω cm) | COMPRESSIVE STRESS (GPa) | TEMPERATURE (° C.) | TIME (MIN.) | ATMOSPHERIC PRESSURE (Torr) | SPECIFIC RESISTIVITY (μ Ω cm) | COMPRESSIVE STRESS (GPa) |
| EXAMPLES ACCORDING TO PRESENT INVENTION | | | | | | | | |
| 1 | 30 | 400 | 0.36 | 240 | 60 | 0.003 | 130 | 0.10 |
| 2 | 70 | 350 | 0.34 | 240 | 60 | 0.003 | 140 | 0.10 |
| 3 | 100 | 330 | 0.34 | 180 | 3 | 0.002 | 180 | 0.34 |
| 4 | 130 | 300 | 0.30 | 180 | 60 | 0.002 | 160 | 0.30 |
| 5 | 70 | 350 | 0.34 | 240 | 10 | 0.003 | 150 | 0.18 |
| 6 | 70 | 350 | 0.34 | 240 | 3 | 0.003 | 160 | 0.26 |
| 7 | 130 | 300 | 0.30 | 180 | 60 | 760 | 170 | 0.33 |
| 8 | 130 | 300 | 0.30 | 180 | 15 | 760 | 175 | 0.35 |
| 9 | 70 | 350 | 0.34 | 240 | 60 | 760 | 168 | 0.30 |
| 10 | 70 | 350 | 0.34 | 240 | 15 | 760 | 170 | 0.31 |
| COMPARATIVE EXAMPLES | | | | | | | | |
| 1 | 180 | 135 | 0.55 | 240 | 60 | 0.002 | 135 | 0.53 |
| 2 | 180 | 135 | 0.55 | 240 | 15 | 760 | 140 | 0.56 |
| 3 | 70 | 350 | 0.34 | — | — | — | — | — |
| 4 | 100 | 330 | 0.34 | — | — | — | — | — |
| 5 | 130 | 300 | 0.30 | — | — | — | — | — |
| 6 | 180 | 135 | 0.55 | — | — | — | — | — |

As will be learned from Table 1, Comparative Examples Nos. 1 and 2, though subjected to heat treatment after formation of ITO film, do not have film compressive stress reduced to a satisfactory level since the substrate temperature during the film formation was out of the range of the present invention, and Comparative Examples Nos. 3 to 5 have film compressive stress reduced to a satisfactory level but have high specific resistance since they were not subjected to heat treatment after formation of ITO film. In contrast, Examples Nos. 1 to 10 according to the present invention all show excellent values in both specific resistivity and film compressive stress compared with the comparative examples.

What is claimed is:

1. A method of manufacturing a transparent conductive film, comprising the steps of:
   1) setting a temperature of a substrate placed in opposed relation to an anode to not more than 130° C.;
   2) generating a plasma beam by discharge plasma generating means constituting a cathode and guiding the plasma beam to said anode such that an evaporation material received in the anode evaporates and particles of the evaporated materials are ionized, to thereby form the transparent conductive film on a surface of the substrate; and
   3) subjecting the transparent conductive film thus formed to a heat treatment at a temperature of not less than 180° C.;

wherein the transparent conductive film has a film compressive stress of 0.28 Gpa or less.

2. A method as claimed in claim 1, wherein the temperature of the heat treatment of said step 3) has an upper limit of 240° C.

3. A method as claimed in claim 1, wherein the heat treatment of said step 3) is conducted for a period of time of 30 to 60 minutes.

4. A transparent conductive film which is formed by the method as claimed in claim 1, wherein the transparent conductive film has a specific resistivity of 230 $\mu\Omega\cdot$cm or less.

5. A method of manufacturing a transparent conductive film as claimed in claim 1, wherein the transparent conductive film is amorphous when it is formed and the transparent conductive film is crystallized subsequently during the heat treatment.

* * * * *